United States Patent [19]

Phan

[11] Patent Number: 5,434,423
[45] Date of Patent: Jul. 18, 1995

[54] SYSTEM AND METHOD FOR OPTIMIZING PLACEMENT OF DOPANT UPON SEMICONDUCTOR SURFACE

[75] Inventor: Tony T. Phan, Austin, Tex.

[73] Assignee: Advanced Micro Devices, Inc., Sunnyvale, Calif.

[21] Appl. No.: 253,576

[22] Filed: Jun. 3, 1994

Related U.S. Application Data

[63] Continuation of Ser. No. 995,698, Dec. 23, 1992, abandoned.

[51] Int. Cl.⁶ .................................. H01J 37/317
[52] U.S. Cl. ............................ 250/492.21; 250/251
[58] Field of Search ............... 250/492.21, 398, 251

[56] References Cited

U.S. PATENT DOCUMENTS

| | | | |
|---|---|---|---|
| 3,908,183 | 9/1975 | Ennis | 250/492.3 |
| 4,383,180 | 5/1983 | Turner | 250/492.2 |
| 4,578,589 | 3/1986 | Aitken | 250/492.21 |
| 4,595,837 | 6/1986 | Wu et al. | 250/398 |
| 4,825,087 | 4/1989 | Renau et al. | 250/423 R |
| 4,870,284 | 9/1989 | Hashimoto et al. | 250/423 R |
| 5,091,655 | 2/1992 | Dykstra et al. | 250/492.2 |
| 5,134,301 | 7/1992 | Kamata | 250/492.21 |
| 5,136,171 | 8/1992 | Leung et al. | 250/492.21 |
| 5,343,047 | 8/1994 | Ono et al. | 250/492.21 |

FOREIGN PATENT DOCUMENTS 0291279  11/1988  European Pat. Off.

*Primary Examiner*—Bruce C. Anderson
*Attorney, Agent, or Firm*—Conley, Rose & Tayon

[57] ABSTRACT

An improved ion implantation system and method for placing dopant upon and within a semiconductor surface. The ion implantation system is capable of higher beam current by reducing dopant concentration across selected surface areas. Offsetting electrons are also diffused to maintain a lower net ion level at the selected areas. Amount of beam current can be increased according to user requirements to enhance throughput of the implantation process. Diffusion of ions and electrons is achieved by reconfiguring or redesigning an acceleration tube placed subsequent to the ion source. The acceleration tube comprises a plurality of electrodes spaced adjacent each other and extending as a pair of rows. Each row extends from a location proximal to the ion source to a location distal to the ion source. Sourcing a power supply upon a more distally located electrode allows the ions and/or electrons to diffuse outward from their acceleration path at a larger spot size upon the semiconductor surface.

12 Claims, 3 Drawing Sheets

SYSTEM AND METHOD FOR OPTIMIZING PLACEMENT OF DOPANT UPON SEMICONDUCTOR SURFACE

This is a continuation of application Ser. No. 07/995,698 filed Dec. 23, 1992, now abandoned.

BACKGROUND OF THE INVENTION

1. Field of the Invention

This invention relates to an ion implantation system and method and more particularly to a system and method for optimizing the placement of dopant material upon a semiconductor surface area.

2. Background of the Relevant Art

Ion implantation is a semiconductor doping process whereby a plurality of dopant atoms are first ionized, then accelerated to velocities sufficient to penetrate the semiconductor surface and deposit within. Well known are semiconductors which can be altered in electrical behavior by the introduction of minute quantities of elemental materials called "dopants." Dopants generally come in either p-type or n-type. P-type dopants (including boron, Al, Ga, Tl, In and/or Si) produce what is commonly known as hole conductivity while n-type dopants (including phosphorous, arsenic and/or antimony) produce what is commonly known as electron conductivity. Combination of hole and electron-rich regions produce the desired devices such as transistors, resistors, diodes, capacitors, etc., which form the basis of semiconductor operation. Recent advances in semiconductor manufacture include fine-line geometries of the dopant materials placed on a substrate to form very large scale integrated devices.

Integrated circuits are generally formed by connecting numerous individual devices set forth by dopant implantation. A single wafer may contain several thousand devices which are diced and individually packaged as a single monolithic circuit. It is important that the doping process be accurately presented to the semiconductor area in order to ensure the monolithic circuit operates according to target design parameters. If doping does not bring about such operation, then the corresponding yields may be drastically reduced thereby adding to the cost of manufacture. Important factors relating to accurate doping are: (i) the need to control the number of doping ions introduced in the surface material, (ii) the need to control the uniformity of doping ions placed across the surface, (iii) the need to control the depth or concentration profile of dopant placed into the surface, and (iv) the need to ensure the doping pattern can be introduced as a maskable pattern on the surface. Each of these factors must be closely monitored and can be achieved by several different techniques. One technique may include bulk diffusion of dopant into non-masked surface regions. Another technique may involve direct sourcing of an ion beam at select fine-line areas into non-masked regions. The latter technique generally involves an ion beam implantation system.

An ion beam implantation system 10 is partially shown in FIG. 1. System 10 generally involves several subsystems. One subsystem is an ion source 12 which functions to supply an "ionized atom" of dopant material. Ion source 12 removes one or more electrons from the dopant atom thereby creating a positively charged ionized atom which can be extracted and accelerated to a target surface such as a semiconductor surface. Elements of an ion source include a relatively high pressure area 14 contained within a first chamber 16. Chamber 16 is configured to receive gaseous compound of selected dopant material. Depending upon the type of dopant used, either p-type of n-type, dopant can be introduced as a gas into chamber 16. The dopant-rich gas containing atoms of the desired species generally receives electrons generated from an ionizing filament 18. Filament 18 radiates electrons when it is heated to a specific temperature and when a specific extraction voltage is applied thereto. Collision, shown as numeral 32, between electrons and gas atoms results in the desired ionization within chamber 14. The ions are then extracted through an aperture 20 placed through the wall of an ionizing (or arc) area. A plurality of ions are extracted through use of an electrostatic field created by charged extraction electrodes 24 placed along ion path 26 as shown. So as to attract positively charged ions, extraction electrodes 24 must receive a negative potential with respect to the ion source. Thus, extraction electrodes 24 are preferably negatively charged relative to ion source 32.

The collision of electrons with dopant atoms may be caused by, e.g., an arc established between the walls of the chamber surrounding area 14 and filament 18. The electrons generally move in a spiral orbit to increase the collision rate with surrounding gas atoms. The mean free path is optimized by a magnetic field placed parallel to filament 18. Magnetic field occurs by powering magnets 30 via terminals 31 as shown.

FIG. 1 illustrates only one of many types of ion sources. Any type of ion source 12 may be used provided it contain the essential elements of having a high pressure area, a source of electrons to collide with desired atomic species within the area, an electric field to mobilize the electrons and atoms resulting in collision, and means for extracting ions from the source. The ion source illustrated herein may use a heated type filament 18 to generate the necessary arc within area 14. Thus, not only is filament 18 powered by a voltage supply connected to leads 32 to achieve emission, but also a powered heater 36 may be used to enhance emission.

Further shown in FIG. 1 is an analyzing magnetic 38. Magnet 38 may be placed adjacent to source 12 as shown in FIG. 1 or, alternatively, it can be placed subsequent an accelerated tube 40 (shown in FIG. 2 according to the present invention). In the latter arrangement, accelerator tube 40 is placed between magnet 38 and source 12. Either arrangement will prove suitable provided magnet 38 is adjusted in size and weight to accommodate delivered extractor energies. For example, if magnet 38 is placed between accelerator tube 40 and source 12, magnet 38 receives ion energies typically of lesser values (i.e., approximately 20 KV) than if magnet is placed downstream of accelerator tube 40 (wherein energies may be 200 KV or more).

Magnet 38 typically functions as a mass analyzer. Ion source often produces many different ions. Only one ion mass is to be selected and placed upon the target. Since ions at source 12 may differ by weight, they can be separated according to their mass. The electric force on the ions is a function of both the mass and charge of the ions such that ions are separated out from each other according to different mass-to-charge ratios. If, for example, a perpendicular magnetic field is utilized as shown in FIG. 1 to achieve mass selection, ions may be bent according to their mass and charge with the lighter ions 42 being bent more and the heavier ions 44 being bent less. An aperture 46 is placed at the output side of magnet 38, and the magnetic field is adjusted via power terminals 48 such that the desired ion goes through aperture 46 and undesirable ions are stopped.

Ion beam 26 is emitted from magnet 38 for possible subsequent processing. Namely, beam 26 may become accelerated upon a target area such as a semiconductor surface. Acceleration may be needed in order to ensure penetration of ions into the surface. The amount of acceleration is directly proportional to a beam current. A problem with many conventional high beam implantation systems is that the associated beam current is confined to be somewhat low. If beam current of beam 26 exceeds a specific amount, the resulting semiconductor surface may receive a large amount of positivewly charged ions during implant thereby resulting in certain defects such as, but not limited to, gate oxide degradation and breakdown. If the beam is scanned quickly across the semiconductor surface, conventional systems still may place non-uniform dopant density across some areas of the surface.

As shown in FIG. 3, electric field between the gate region and the substrate region (i.e., across the gate oxide) demonstrates a fairly linear relationship between beam current and electric field. As beam current increases, the amount of dopant ions placed within the polysilicon gate may also be proportionally increased. However, once beam current exceeds a certain value, then the resulting electric field will exceed a critical level, denoted as $E_{max}$. Electric field exceeding $E_{max}$ is deemed to cause gate oxide breakdown whenever an applied gate voltage exceeds an unacceptably low amount. Susceptability to breakdown results from a large build up of negatively charged electrons attracted to the gate oxide/substrate interface configured below the gate region. The electrons are attracted by the large ion dopant level on the overlying gate, forcing the electrons to become trapped within the substrate region causing current to flow through the gate oxide from the gate-applied power source whenever the applied gate potential rises above a certain breakdown voltage amount. Build up of ion concentration (or "dopant level") exceeding the critical amount, $E_{max}$, will allow undesirably low applied voltage to cause gate oxide breakdown. Gate voltages which are within the designer's range but which exceed the low breakdown voltage will cause the circuit to malfunction when it should not have done so. As shown in FIG. 3, most conventional ion beam implantation systems utilize beam currents that are less than five millamperes, the upper range being restricted by $E_{max}$.

It is important in the manufacture of a semiconductor circuit that breakdown voltages be quite large in order to prevent malfunction of the circuit. A lower beam current can achieve this objective. However, higher beam currents allow faster doping across the semiconductor surface, thereby increasing throughput of the implantation process. High beam current implanters generally employ mechanical scanner which move the target relative to the implant beam. However, the mechanical scanners are usually too slow and cannot avoid the instantaneous charging or beam influx upon the target area. For example, the spin and scan speeds of Applied Materials, Inc. model no. AMT-9200 implanter are 1300 r.p.m. and 15 cm/sec, respectively. Unless spin exceeds nearly 5000 r.p.m., instantaneous current density influx can become significant. However, high spin rates requires time necessary to ramp to and from the higher rates. Further, a heavy spin wheel poses a mechanical force limitation beyond which the spin rate of the target cannot exceed without causing periodic damage to the spin mechanism. As such, there remains a need for high beam current implantation systems which do not prove detrimental in achieving an optimal circuit performance having higher breakdown voltage levels.

SUMMARY OF THE INVENTION

The problems outlined above are in large part solved by the ion implantation system of the present invention. That is, the ion implantation system herein achieves high beam current exceeding five milliamperes, and in many instances above ten millamperes, while producing a semiconductor circuit which performs having higher breakdown voltages. Higher breakdown voltages are achieved by presenting an ion implantation system capable of dispersing ions at a larger spot size upon the semiconductor surface. Simultaneously, low-energy electrons are flooded upon the surface at the larger spot size to offset any non-uniform regions of abnormally high ion dopant levels upon the surface. Dispersing or spreading the ion beam is achieved by reconfiguring or retrofitting the accelerator tube of an ion acceleration system. An electron source, or flood gun, produces low energy electrons sent from an argon gas chamber toward the ion spot size impinging upon the semiconductor surface. The advantages provided by reconfiguring the acceleration electrodes and directing low energy electrons is that of achieving a much higher than normal beam current thereby increasing wafer throughput at uniform or substantially uniform dopant level.

Broadly speaking, the present invention contemplates an improved ion implantation system. The system comprises an ion source and a plurality of acceleration electrodes spaced apart from each other from a location proximal to the ion source to a location distal to the ion source. A voltage supply is connected to at least one of the acceleration electrodes located nearer the distal location than the proximal location. An electron source is also included having a flood gun filament surrounded by a chamber capable of receiving a gaseous compound of argon material. A plurality of ions may then be directed from the ion source at a beam current exceeding five milliamperes while simultaneously directing a plurality of electrons from the electron source.

The ion source includes an ionizing filament and a first chamber capable of receiving the ionizing filament. The filament can be heated thereby causing the generation of a plurality of ions through which they can be extracted from an aperture placed through a side wall of the first gas chamber. The first chamber can be evacuated and filled with a gaseous compound such as phosphorous, arsenic, boron, or any other type of semiconductor dopant material common in the art.

The ion implantation system also includes a plurality of acceleration electrodes. Acceleration electrodes are configured as two rows of electrodes, each electrode having a substantially planar surface placed substantially parallel to other electrodes within each row. Each row extends an equal distance from the ion source. Separation between the rows forms a path capable of receiving a beam of ions transmitted from the ion source.

Of significant importance to the present invention is the voltage supply being connected to at least one acceleration electrode placed at or near a distally located electrode (i.e., connected to the most distally located electrode or next to or adjacent the most distally located electrode). Preferably, the voltage supply need only be connected nearer the distally located electrode than the proximally located electrode within one or both rows.

The present invention also contemplates an ion implantation system including an ionizing filament placed within a first chamber containing a gaseous compound of dopant material. The filament may be positively charged and heated, and at least one negatively charged extraction electrode may be placed adjacent the inside surface of the first chamber proximate to an aperture placed through a side wall of the first chamber. Two rows of acceleration electrodes, each electrode having a substantially planar surface placed substantially parallel to each other and extending from a location proximal to the aperture to a location distal to the aperture. Two rows of acceleration electrodes thereby form means for accelerating ions from the aperture through a separation between the rows, the separation being sufficient to accommodate a beam of ions transmitted from the aperture. A voltage supply is connected to at least one or the acceleration electrodes located nearer the distal location than the proximal location. An electron source is further included having a flood gun filament surrounded by a second chamber capable of receiving a gaseous compound of argon material. The beam of ions may be directed upon a semiconductor surface area from the acceleration electrodes at a high beam current and for simultaneously directing electrons upon the semiconductor surface area from the electron source.

The present invention still further contemplates a method for implanting dopant upon a semiconductor surface. The method includes the steps of generating a beam of ions at a beam current exceeding five milliamperes from a first chamber containing a gaseous compound of dopant material. A beam of low energy electrons may also be generated from a second chamber containing a gaseous compound of argon material. The size of the beam of ions can be expanded and directed upon a semiconductor surface area. A lower beam current density thereby results from a larger beam size, which can be a benefit to target gate oxide integrity. The beam of low energy electrons is necessary to avoid damage to the target gate oxide area. Using higher argon flow exceeding 2 ml/min causes more collisions between negatively charged electrons and the argon atoms thereby lowering the mean free path of electrons within the second chamber. The expanding step includes increasing the spacing between a negatively charged acceleration electrode and an aperture placed through the first chamber. Increasing the spacing may be achieved by coupling a negative voltage supply to an acceleration electrode placed within a row of electrodes, the coupled acceleration electrode is at a more distal location from the first chamber than a majority of other electrodes.

BRIEF DESCRIPTION OF THE DRAWINGS

Other objects and advantages of the invention will become apparent upon reading the following detailed description of the invention and upon reference to the accompanying drawings in which.

Figure 1:
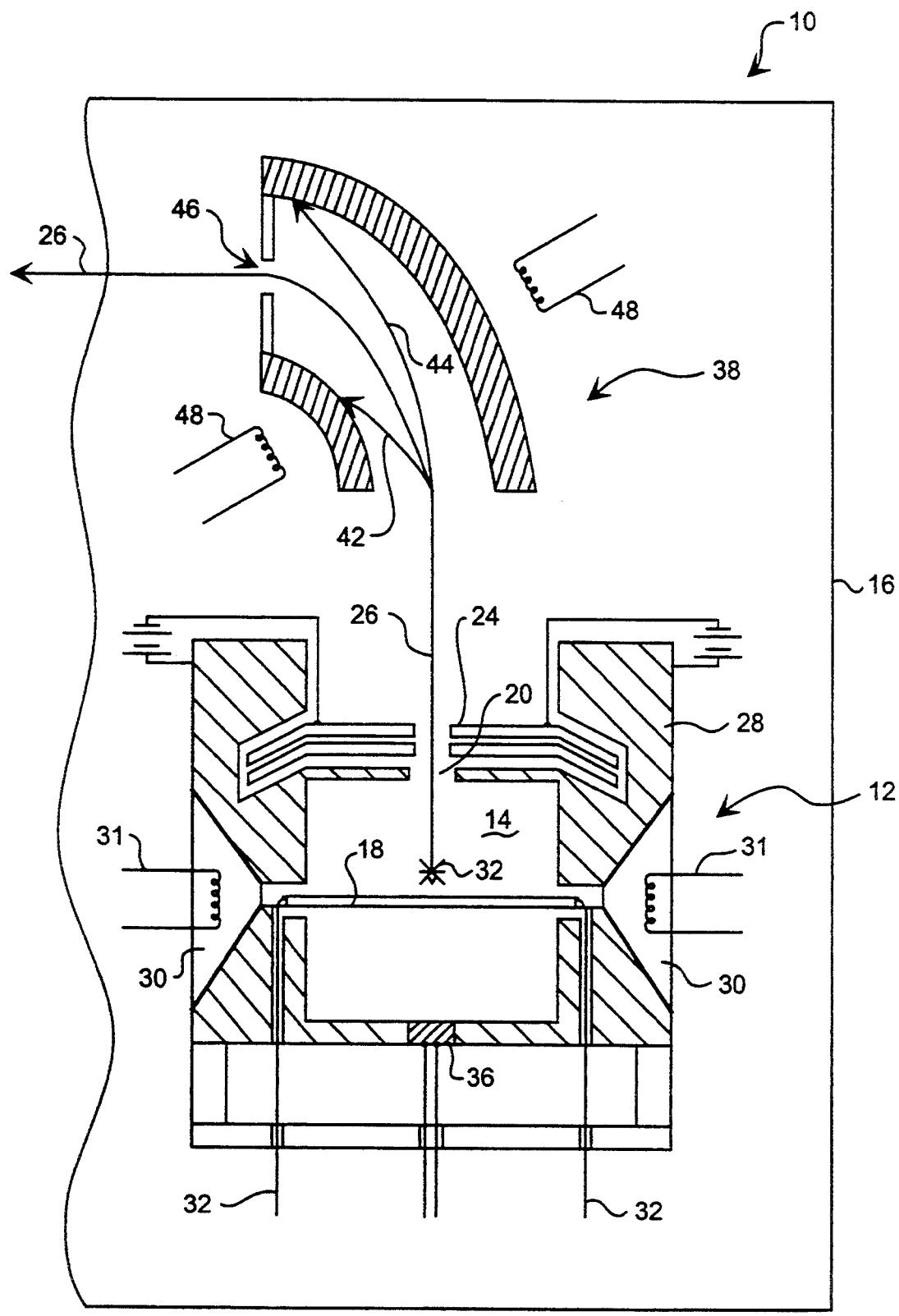
FIG. 1 is a cross-section plan view of an ion implantation system according to a prior art design.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed but on the contrary, the intention is to cover all modifications, equivalents and alternatives falling within the spirit and scope of the present invention as defined by the appended claims.

DETAILED DESCRIPTION OF THE INVENTION

Figure 2:
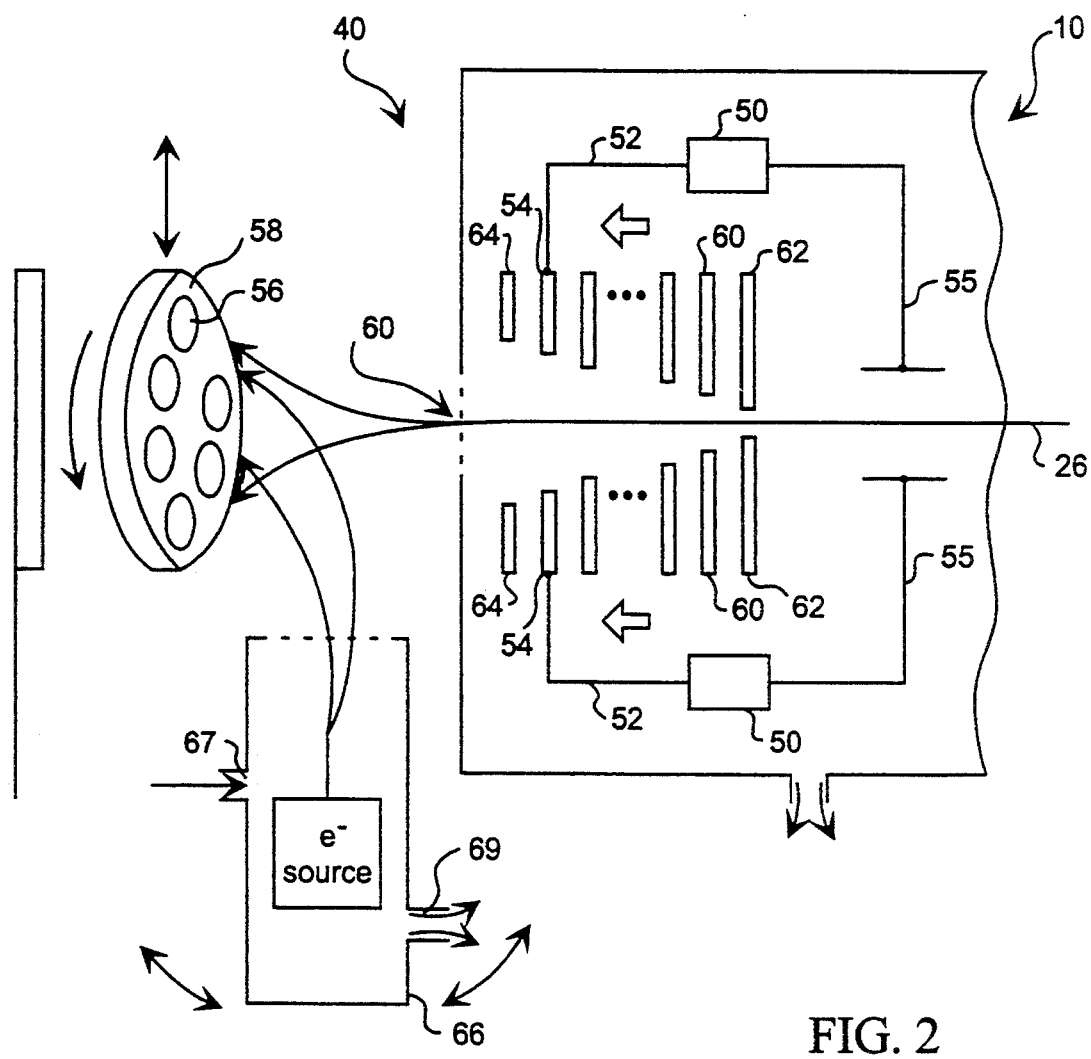
FIG. 2 is a cross-section plan view of an ion implantation system including an acceleration tube and an electron source capable of directing beams upon a target surface area according to the present invention.
Figure 3:
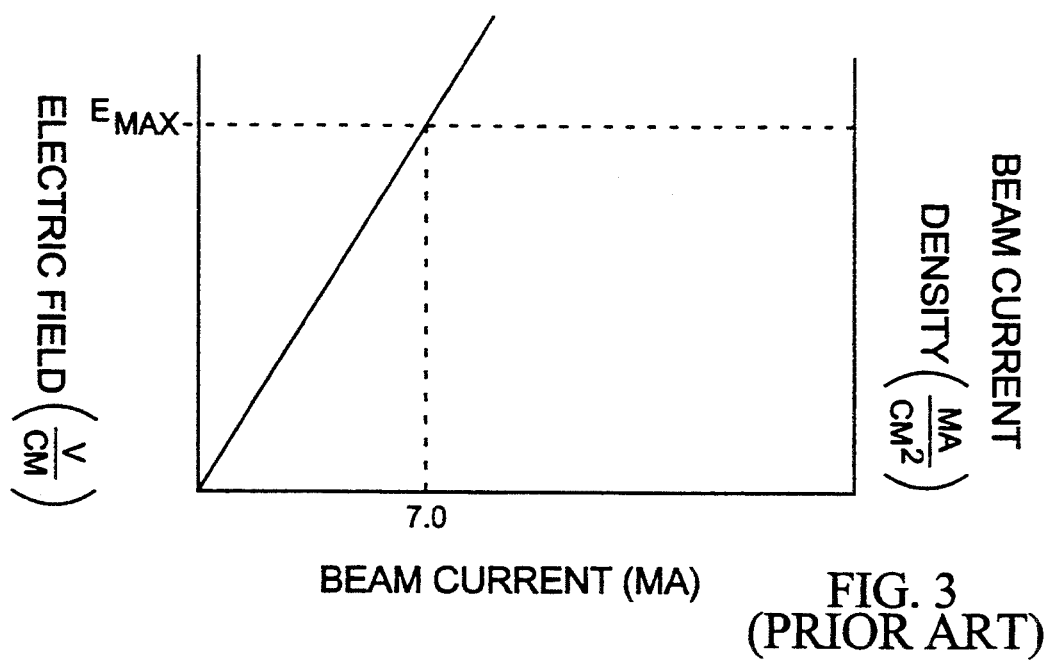
FIG. 3 is a graph illustrating beam current curve as a function of electric field achievable by a prior design.

Turning now to the drawings, FIG. 2 illustrates an acceleration tube 40 configured to receive beam 26. Acceleration tube 40 contains a plurality of acceleration electrodes configured as shown. Desired ions emitted from aperture 46 of FIG. 1 are shown traveling along ion path 26 and into accelerator tube 40. Thus, FIG. 2, entails an acceleration tube 40 placed or retrofitted to existing ion source 12 and magnet 38 of previous designs. Acceleration tube 40 thereby forms a completed improved ion beam acceleration system 10 including source 12, magnet 38 and tube 40. Acceleration tube 40 being a part of that system functions to attract, for example, positively charged ions by connecting a voltage supply 50 having a negatively charged terminal 52 to one or more substantially planar acceleration electrodes 54.

As shown in FIG. 2, acceleration electrodes 54 are preferably arranged in two rows, each electrode spaced from adjacent planar electrodes with their planar surfaces arranged substantially parallel to each other. The separation between each row of spaced electrodes accommodates ion path 26 from aperture 46 to a surface area 56. Separation between rows of electrodes can be adjusted to form a wider or narrower path 26 leading from aperature 46 to electrodes 54. Since dopant from beam 26 must be deposited uniformly over the entire surface of each wafer 56, it is important that beam 26 be spread uniformly over this area. As discussed above, the density of ions in a cross-section of beam 26 is not uniform, so one cannot simply allow the beam to remain stationary and directly impinge upon the surface. Instead, the beam must be scanned across the semiconductor surface by either moving the beam with respect to a stationary surface (e.g., a wafer) or by moving the surface with respect to the beam. Either technique is suitable for purpose of the present invention. The latter technique is illustrated in FIG. 2 as having surface 56 placed in plurality across the surface of a rotating wheel 58 which also moves laterally in the vertical or horizontal direction as shown.

Ion beam 26 is configured for emission from aperture 60 having a varying beam current. According to beam current-to-dose conversion relationships commonly known in the industry, one microampere corresponds to one microcouloumb/second. In addition one microcouloumb equals $6.3 \times 10^{12}$ ions. Therefore, one microampere equals $6.3 \times 10^{12}$ ions/second. To convert the microampere (or ions/second) beam current terminology to dopant level terminology, which is expressed in ions/centimeters$^2$, it is important to note that the relationship between beam current and dopant level is as follows:

Beam Current * Time/Surface Area = Dopant Level

Using the above relationship, a one microampere beam current scanned across a 63 cm$^2$ (3 inch wafer) surface within a ten second time frame relates to a $6.3 \times 10^{12}$ ions/sec, 10 seconds/63 cm$^2$ = $1 \times 10^{12}$ ions/cm$^2$ as a resulting dopant level.

As seen by the above relationship, if beam current is increased, ionization time can be correspondingly decreased to achieve the same dopant level upon the same surface area. As such, it is advantageous that a maximum beam current be used to increase the throughput of ion implantation. Faster implantation will allow more wafers to be doped using a single ion implantation system. Thus, faster implantation need not require purchase of additional systems to achieve the same throughput.

As shown in FIG. 2, faster implantation can be achieved by an improved implantation technique of the present invention. Ion implantation herein includes connecting negative voltage terminal 52 to an acceleration electrode 54 configured near a location more distal from source 12 than the location of a majority of other electrodes. Specifically, electrode 54 is shown placed at a more distal location than electrode 60. Further, electrode 60 is placed more distal than electrode 62. Provided terminal 54 is connected at a location more distal than a majority of electrodes or, alternatively, is placed at the most distal location, e.g., at electrode location 64, then one aspect of the present invention can be achieved. Namely, by connecting negative terminal 52 at a distally located electrode, then ion beam 26 is accelerated with less electric field than if terminal 52 is connected to a more proximal electrode, It is well known that electric field is directly proportional to the magnitude of voltage placed at opposite ends of the field and is inversely proportional to the distance between said opposite ends. By connecting negative terminal 54 at a further distance from the positive terminal 55, electric field area is spread over a longer area thereby decreasing electric field magnitude given a constant terminal voltage. A lesser electric field magnitude allows ions within path 26 to disperse within the separation distance between electrode rows to a greater extent than if the electric field distance is shorter. As such dispersion of beam 26 at aperture 60 allows an increase in the geometric range or spot size of ions upon surface 54. Thus, a greater surface area can be covered with beam 26.

Another aspect of the present invention is the use of an electron source 66 such as an electron flood gun having its emission spatially directed at surface 56 substantially simultaneous with the arrival of beam 26. Electron source 66 can be configured similar to ion source 12, however, instead of ion emission, electrons are emitted and possibly accelerated via an acceleration tube upon surface 56. The detailed mechanism of electron source 66 and acceleration mechanism are not shown, it being understood that those details are common and correlate with the details described above for an ion implantation system 10 comprising those respective subsystems. Electron source 66 preferably includes a flood gun filament (not shown) surrounded by a chamber (not shown) capable of receiving a gaseous compound of argon material. A suitable electron flood gun capable of receiving a gas may be obtained from Applied Material, Inc. of Horsham, England, model no. PI-9200. It is specifically contemplated by the present invention that argon present within the electron source chamber helps reduce the mean free path of electrons necessary for collision with associated ion. Reduction in mean free path thereby increases secondary low energy electron collision with the argon gas. Conventional flood guns do not employ argon gas. Argon gas, involve heavy argon atomic particles which are more prone to receive colliding initial high energy electrons. A resulting secondary electron energy will remain, but having a substantially smaller energy value—a large loss in energy occurs due to collision with the heavy argon atoms. The secondary electron energy is thereby suitably used for placement on the target wafer. Moreover, some argon ions travel with the secondary electrons and impinge upon the target. However, since argon is an inert material, placement of argon upon the wafer will not adversely affect electrical characteristics of the resulting circuit. As such, increased low energy electron output is achieved by the present invention and can be spread out to geometrically match with beam 26 on surface 56 whereby implantation of ions on selected areas also includes associated electrons. As shown in FIG. 2, argon gas is allowed to enter or bleed into a chamber of source 66 through port 67. Argon gas may be extracted through port 69 after use.

Figure 4:
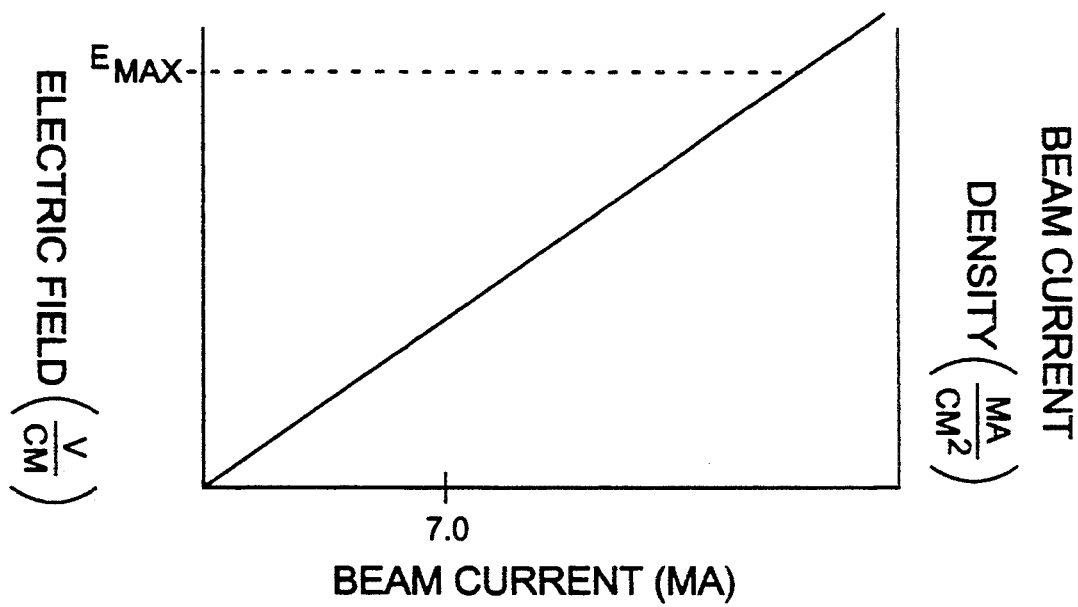
FIG. 4 is a graph illustrating beam current curve as a function of electric field achievable by an ion implantation system according to the present invention.

FIG. 4 illustrates improved ion implantation system of the present invention having relatively high beam current exceeding 5 ma, and more preferably exceeding 10 ma. Beam current along path 26 is somewhat dispersed to a larger spot size in accordance with the advantages of the electrode configuration described above. The larger spot size is generally the result of a more distal connection of terminal 52, preferably within 25 cm. of output aperture 60 as shown in FIG. 2. As shown in FIG. 4, a beam current exceeding 5 ma, and possibly near 10 to 20 ma, is dispersed across surface 56 at a lower energy level to affect a lower electric field at a given doping time and doping area. It is postulated that beam current upward of 10 to 20 ma can achieve electric field differential across a gate oxide less than the critical field amount, or $E_{max}$, necessary to maintain high preferred breakdown voltages. Therefore, according to implantation of the present invention, large beam current will not allow low applied voltages to cause gate breakdown of a resulting semiconductor device.

Figure 5:
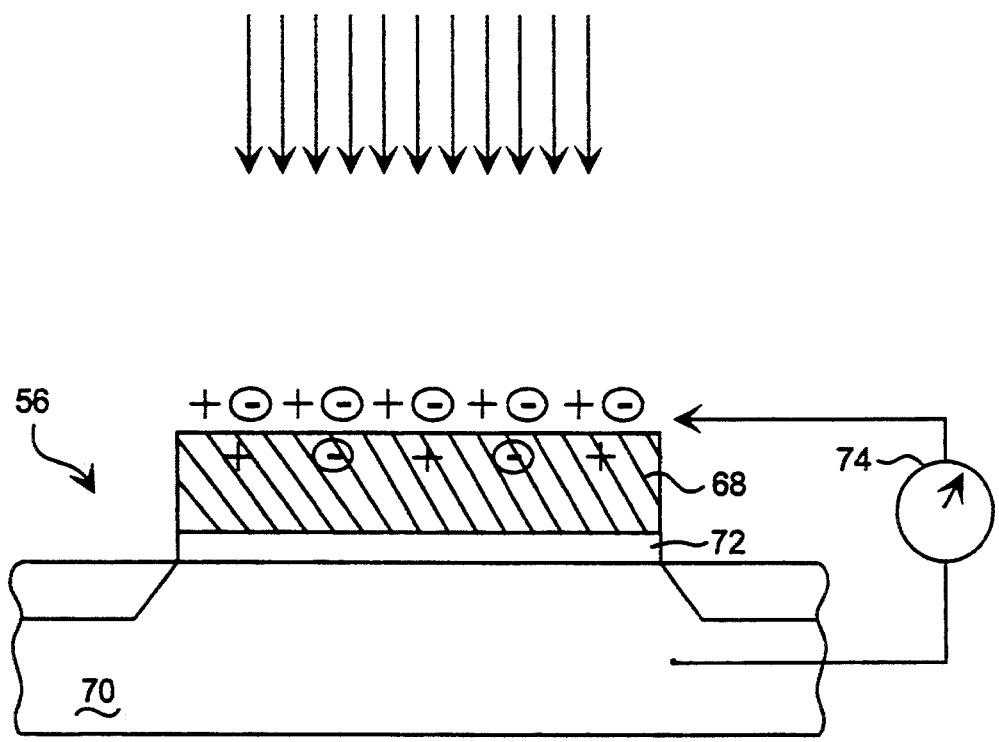
FIG. 5 is a cross-section view of a semiconductor surface and related apparatus for measuring electric field characteristics upon that surface according to the present invention.

Referring to FIG. 5, breakdown voltage of a resulting semiconductor device is measured according to the set up shown. Specifically, dopant ions from system 10, including low-energy electrons from source 66 are shown deposited upon and within the upper surface of a gate region 68. The deposited electrons help offset the net positive ion charge. Without the offsetting negative electrons, fairly large amounts of trapped electrons would be attracted within the gate oxide area 72 and within substrate 70 near the gate oxide/substrate interface. The trapped electrons are mobile and can move in response to an applied voltage from instrument 74 placed across the gate region 68 and substrate 70. A current magnitude can be read by instrument 74 (comprising a voltage and/or current source/meter) as a result of the applied voltage. If an electric field $E_{max}$ exceeding approximately $10^7$ V/cm, then gate oxide breakdown voltage may occur. Such might be the case whenever voltage across the terminals of a 100–200 Å gate oxide exceeds 10–20 V. It is a principal object of the present invention to increase breakdown voltage, i.e., increase the amount of applied voltage necessary to achieve breakdown. The higher the breakdown voltage the less likely the circuit will malfunction during voltage or current spikes (or noise) applied to the gate region.

It will be appreciated to those skilled in the art having the benefit of this disclosure that this invention is believed to be capable of applications with numerous types of ion implantation systems capable of imparting ions upon and into a silicon material. Various modifications and changes may be made without departing from the Spirit and scope of the invention as set forth in the claims. It is intended that the following claims be interpreted to embrace all such modifications and changes.

What is claimed is:

1. An ion implantation system, comprising:
   an ion source;
   a plurality of acceleration electrodes housed within an acceleration tube having an output aperture placed through a portion of said tube, said acceleration electrodes are spaced apart from each other from a location proximal to said ion source to a location distal to said ion source;
   a voltage supply connected between said ion source and at least one of said acceleration electrodes, wherein the connected said at least one acceleration electrodes is located nearer said distal location than said proximal location and is within 25 cm. of said output aperture;
   an electron source including a flood gun filament surrounded by a chamber capable of receiving a gaseous compound of argon material; and
   means for directing a plurality of ions from said ion source, through said output aperture, and upon a semiconductor gate region at a beam current exceeding five milliamperes and for simultaneously directing a plurality of electrons from said electron source such that a resulting electric field upon said gate region is less than $10^7$ V/cm.

2. The ion implantation system as recited in claim 1, wherein said ion source comprises:
   an ionizing filament;
   a first chamber capable of receiving said ionizing filament;
   means for heating said ionizing filament within said first gas chamber; and
   means for extracting a plurality of ions through an aperture placed through a side wall of said first gas chamber.

3. The ion implantation system as recited in claim 2, wherein said first chamber is capable of being evacuated and filled with a gaseous compound of phosphorus.

4. The ion implantation system as recited in claim 2, wherein said first chamber is capable of being evacuated and filled with a gaseous compound of arsenic.

5. The ion implantation system as recited in claim 2, wherein said first chamber is capable of being evacuated and filled with a gaseous compound of boron.

6. The ion implantation system as recited in claim 2, wherein said extraction means comprises at least one negatively charged extraction electrode placed adjacent the inside surface of said first chamber proximate to said aperture.

7. The ion implantation system as recited in claim 1, wherein said plurality of acceleration electrodes comprises:
   two rows of said acceleration electrodes, each electrode having a substantially planar surface placed substantially parallel to other said electrodes within two rows extending an equal distance from said ion source; and
   a separation between said rows, wherein said separation forms a path capable of receiving a beam of ions transmitted from said ion source.

8. The ion implantation system as recited in claim 1, wherein said voltage supply comprises a negative voltage terminal and a positive voltage terminal, said negative voltage terminal is connected to said at least one of the acceleration electrodes and said positive voltage terminal is connected to said ion source, said negative voltage terminal connected to said at least one of the acceleration electrodes allows said plurality of ions to disperse upon select areas of a semiconductor wafer while maintaining said beam current exceeding five milliamperes.

9. The ion implantation system as recited in claim 1, wherein said directing means comprises:
   an ion beam emitted from said ion source and through a path between a pair of rows of said acceleration electrodes;
   an electron beam emitted from said electron source toward said ion beam; and
   an integrated circuit area configured to receive said ion beam and said electron beam at substantially the same time.

10. The ion implantation system as recited in claim 1, wherein said voltage supply is connected to at least one said acceleration electrode placed at said distal location immediately spaced adjacent to the most distally located said acceleration electrode.

11. The ion implantation system as recited in claim 1, wherein said voltage supply is connected to at least one said acceleration electrode placed at said distal location, distally located from all others of said acceleration electrodes.

12. A method for implanting dopant upon a semiconductor surface area comprising the steps of:
   generating a beam of ions at a beam current exceeding five milliamperes from a first chamber containing a gaseous compound of dopant material;
   generating a beam of low energy electrons from a second chamber containing a gaseous compound of argon material;
   expanding the size of said beam of ions and said beam of electrons, wherein said expanding step comprises coupling a negative voltage supply to an acceleration electrode placed within a row of electrodes arranged within an acceleration tube, said coupled acceleration electrode is at a more distal location from said first chamber than a majority of other said acceleration electrodes and said coupled electrode is within 25 cm. of an output aperture placed through said acceleration tube at the most distal location from said first chamber; and
   directing said expanded beam sizes of said beam of ions and said beam of electrons upon a semiconductor surface area such that a resulting electric field upon a gate region is less than $10^7$ V/cm.

* * * * *